US012681058B2

(12) United States Patent
Zhang

(10) Patent No.: US 12,681,058 B2
(45) Date of Patent: Jul. 14, 2026

(54) METHOD FOR FAST AND ACCURATELY SENSING POWER GRID INFORMATION BASED ON NONLINEAR ROBUST ESTIMATION

(71) Applicant: SHANDONG UNIVERSITY, Jinan (CN)

(72) Inventor: Chenghui Zhang, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 476 days.

(21) Appl. No.: 18/032,681

(22) PCT Filed: Sep. 27, 2022

(86) PCT No.: PCT/CN2022/121826
§ 371 (c)(1),
(2) Date: Apr. 19, 2023

(87) PCT Pub. No.: WO2023/071672
PCT Pub. Date: May 4, 2023

(65) Prior Publication Data
US 2024/0377440 A1     Nov. 14, 2024

(30) Foreign Application Priority Data
Oct. 25, 2021     (CN) .......................... 202111237471.0

(51) Int. Cl.
*G01R 19/25*          (2006.01)
*G01R 19/175*         (2006.01)

(52) U.S. Cl.
CPC ....... *G01R 19/2513* (2013.01); *G01R 19/175* (2013.01)

(58) Field of Classification Search
CPC .. G01R 19/2513; G01R 19/175; G01R 31/00; H02J 3/00; H02J 2203/20
See application file for complete search history.

(56) References Cited

U.S. PATENT DOCUMENTS

2010/0187914 A1      7/2010  Rada et al.
2016/0105093 A1*     4/2016  Della Flora ............. H02M 1/32
                                                              363/55

FOREIGN PATENT DOCUMENTS

CN          103078545 A  *  5/2013
CN          103595777 A      2/2014
                (Continued)

OTHER PUBLICATIONS

Huihong Zhao et. al., "H Estimation for a Class of Lipschitz Nonlinear Discrete-Time systems with Time Delay", 2011, Hindawi Publishing Corporation (Year: 2011).*
(Continued)

*Primary Examiner* — Yossef Korang-Beheshti
(74) *Attorney, Agent, or Firm* — Oliff PLC

(57)          ABSTRACT

A method for sensing power grid information based on nonlinear robust estimation, may include: acquiring a phase voltage signal of actual power grid; obtaining a nonlinear state-space distorted power grid model based on the phase voltage signal of actual power grid and a virtual orthogonal signal of phase voltage signal; establishing an H∞ smoothing estimation performance indicator based on the nonlinear state-space distorted power grid model, converting an H∞ smoothing estimation problem into a generalized $H_2$ smoothing estimation problem according to the H∞ smoothing estimation performance indicator, and constructing an H∞ smoothing estimator; and obtaining an initial sensed amplitude value and an initial sensed phase value of power grid voltage signal by using the H∞ smoothing estimator, and performing zero-crossing point detection on the initial sensed amplitude and phase values of the power grid voltage signal to obtain sensed amplitude, frequency and phase values of a distorted voltage.

8 Claims, 8 Drawing Sheets

(56) References Cited

FOREIGN PATENT DOCUMENTS

| | | | | | |
|---|---|---|---|---|---|
| CN | 103676646 | A | | 3/2014 | |
| CN | 105425011 | A | | 3/2016 | |
| CN | 105606893 | A | | 5/2016 | |
| CN | 106356840 | A | * | 1/2017 | ............... H02J 3/00 |
| CN | 107611971 | A | | 1/2018 | |
| CN | 108155643 | A | | 6/2018 | |
| CN | 109861268 | A | * | 6/2019 | |
| CN | 112187079 | A | * | 1/2021 | ......... H02M 7/4835 |
| CN | 113675850 | A | | 11/2021 | |

OTHER PUBLICATIONS

Huanshui Zhang et. al., "A distributed Algorithm for H-infinity fixed lag smoothing", 2005, Journal of Control Theory and Applications (Year: 2005).*

Zhao et al.; "H-infinity estimation for discrete-time Lipschitz non-linear time-varying delay systems: Krein space approach;" Control and Decision; 2012; pp. 1621-1632; vol. 27, No. 11.

Ma et al.; Delay-dependent robust H-infinity control for uncertain discrete-time singular systems with time-delays; Journal of Computational and Applied Mathematics; 2008; pp. 194-211; vol. 217.

Dec. 16, 2022 Search Report issued in International Patent Application No. PCT/CN2022/121826.

Dec. 16, 2022 Written Opinion of the International Searching Authority issued in International Patent Application No. PCT/CN2022/121826.

* cited by examiner

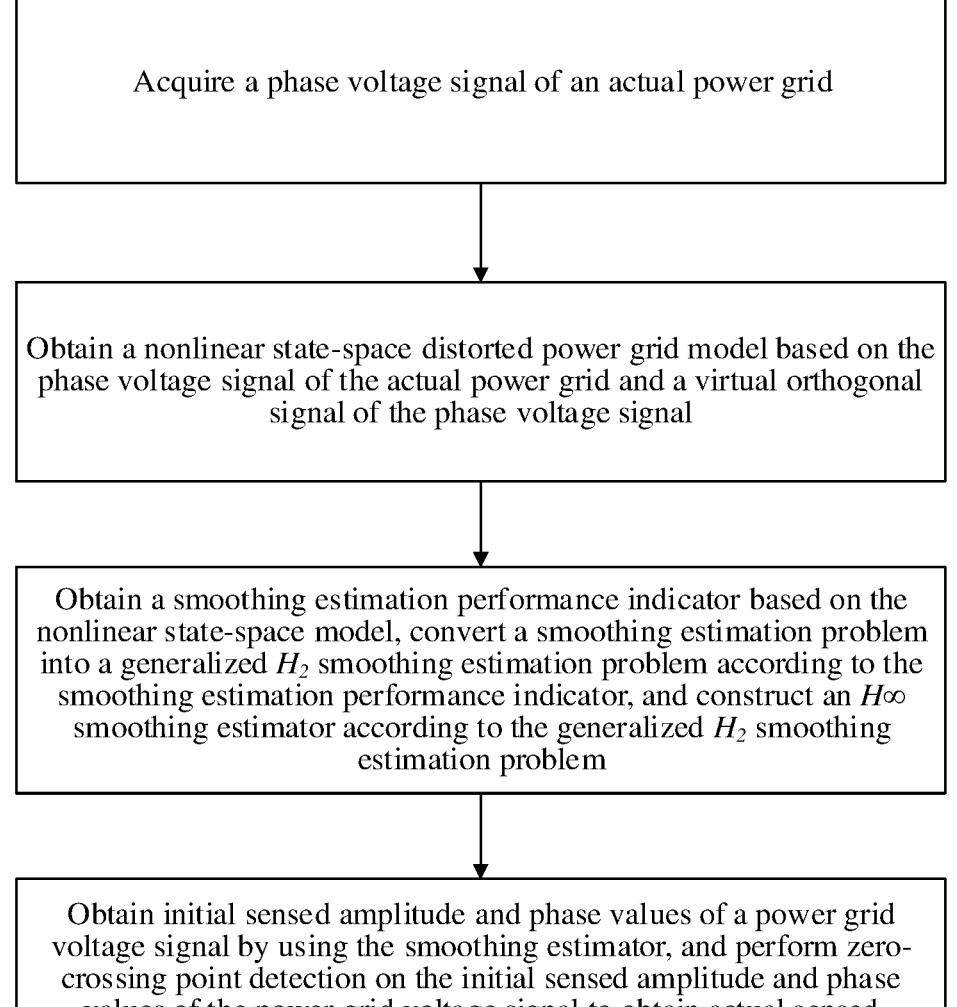

Acquire a phase voltage signal of an actual power grid

Obtain a nonlinear state-space distorted power grid model based on the phase voltage signal of the actual power grid and a virtual orthogonal signal of the phase voltage signal Obtain a smoothing estimation performance indicator based on the nonlinear state-space model, convert a smoothing estimation problem into a generalized $H_2$ smoothing estimation problem according to the smoothing estimation performance indicator, and construct an $H\infty$ smoothing estimator according to the generalized $H_2$ smoothing estimation problem Obtain initial sensed amplitude and phase values of a power grid voltage signal by using the smoothing estimator, and perform zero-crossing point detection on the initial sensed amplitude and phase values of the power grid voltage signal to obtain actual sensed amplitude, frequency and phase values of a distorted voltage

FIG. 1

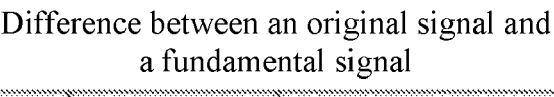
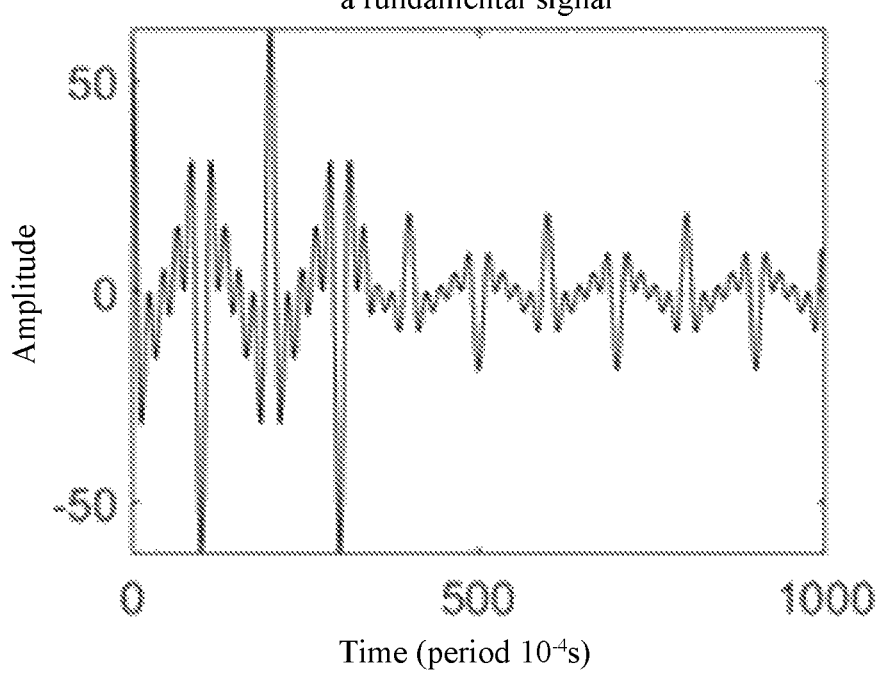
FIG. 3(b)
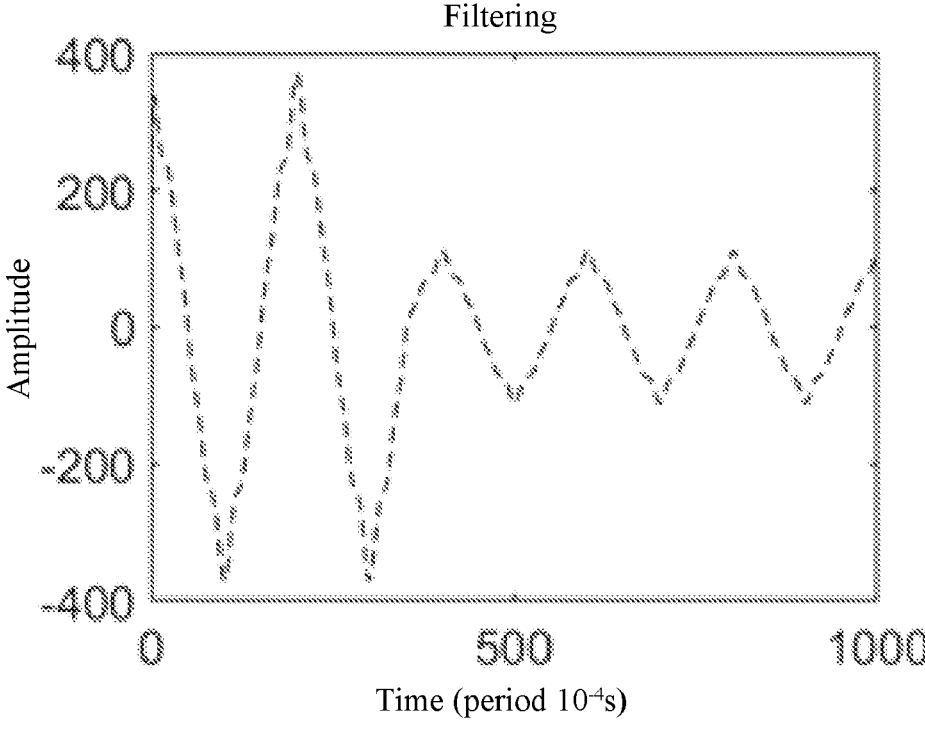
FIG. 3(c)

Difference between an original signal and
a fundamental signal

Time (period 10⁻⁴s)

Smoothing

Time (period 10⁻⁴s)

Sensing signal (zero-crossing point detection + real-time amplitude sensing)

Sensing error (zero-crossing point detection + real-time amplitude sensing)

METHOD FOR FAST AND ACCURATELY SENSING POWER GRID INFORMATION BASED ON NONLINEAR ROBUST ESTIMATION

The present disclosure claims priority to Chinese Patent Application No. 202111237471.0, filed on Oct. 25, 2021 in China National Intellectual Property Administration and entitled "METHOD FOR FAST AND ACCURATELY SENSING POWER GRID INFORMATION BASED ON NONLINEAR ROBUST ESTIMATION", which is hereby incorporated by reference in its entirety.

TECHNICAL FIELD

The present disclosure relates to the field of power grid voltage amplitude/frequency/phase information sensing technologies, and in particular, to a method for fast and accurately sensing power grid information based on nonlinear robust estimation.

BACKGROUND

Descriptions of this part only mention a background technology related to the present disclosure, and do not necessarily constitute the related art.

Developing new energy is a key way to solve energy crisis and environmental pollution. However, as new energy is connected to a power grid on a large scale, problems about reliable grid connection for power generation have become increasingly prominent and strictly restricted healthy development of the industry. Particularly, a new energy station is often located at the end of a power grid architecture, and equivalent impedance between a grid connection point and a remote main grid is high. As a result, the problems of drop, distortion, frequency instability, and the like are easy to occur in the power grid voltage, and inadequate sensing control, which may make the new energy station off-grid and even threaten safe and stable running of a local power grid without inadequate sensing control.

Grid-connected equipment is a core of energy conversion in a new-energy power generation system, and its performance directly determines stable running and power quality of the system. Fast and accurately sensing power grid information (amplitude/frequency/phase) is an important foundation for safe running and energy control of the grid-connected equipment.

Many scholars have conducted in-depth research on power grid information sensing technologies, for example, a hardware-circuit-based zero-crossing method, a fundamental-wave Fourier transformation method, a Kalman filtering method, and a dq-transformation-based synchronous reference frame (SRF) phase locking method. However, in the new-energy power generation system, a waveform (amplitude/frequency/phase) of the power grid voltage is distorted seriously, so it is hard to meet a requirement of the grid-connected equipment of the new-energy power generation system for quick and accurate sensing of power grid information by using the foregoing existing methods. In an open-loop linear filtering sensing method, a deviation is great. The larger a window length of a filter is, the slower a dynamic response is. In a moving average filtering sensing method, the window length needs to make a compromise between a response speed and a filtering effect. For a feedback-principle-based phase-locked loop method, it is hard to reconcile a conflict between sensing accuracy and high speed.

SUMMARY

In order to overcome shortcomings of an existing method, for example, poor robustness, incapability of real-time calculation, low estimation accuracy, and low tracking speed, the present disclosure proposes a method for fast and accurately sensing power grid information based on nonlinear robust estimation. Mechanism analysis and discretizing are performed on a power grid voltage signal to establish a type of Lipschitz nonlinear system model, and a Lipschitz nonlinear smoother is further constructed based on a space mapping technology and an output reconstruction method to improve robustness and accuracy of sensing fundamental information (amplitude/frequency/phase) of a distorted power grid.

The method for fast and accurately sensing power grid information based on nonlinear robust estimation includes:

acquiring a phase voltage signal of an actual power grid;

obtaining a nonlinear state-space distorted power grid model based on the phase voltage signal of the actual power grid and a virtual orthogonal signal of the phase voltage signal;

establishing an H∞ smoothing estimation performance indicator based on the nonlinear state-space distorted power grid model, converting an H∞ smoothing estimation problem into a generalized $H_2$ smoothing estimation problem, and constructing an H∞ smoothing estimator; and obtaining an initial sensed amplitude value and an initial sensed phase value of a power grid voltage signal by using the H∞ smoothing estimator, and performing zero-crossing point detection on the initial sensed amplitude value and the initial sensed phase value of the power grid voltage signal to obtain actual sensed amplitude, frequency and phase values of a distorted voltage.

Compared with the prior art, the present disclosure has the following beneficial effects.

The method of the present disclosure is mainly used for fast and accurately sensing a fundamental frequency, an amplitude, and a phase of a power grid voltage. Compared with a conventional phase-locked loop, the method has the advantages that a transient tracking transition process is eliminated, and high speed and accuracy are ensured. According to the method, an amplitude/frequency/phase of a signal is sensed according to the distorted power grid model by using the space mapping technology and the output reconstruction method, without dependence on a conventional linearization method, and integrity of the signal is ensured by using a nonlinear method. The present disclosure provides a method for robustly and fast calculating a parameter. Simulation shows that the method and parameter selection proposed in the present disclosure have good effects in extraction of a fundamental component and a harmonic component of a power grid.

Advantages of additional aspects of the present disclosure will be partially presented in the following descriptions or get understood by implementing the present disclosure.

BRIEF DESCRIPTION OF THE DRAWINGS

The drawings of the specification, which constitute a part of the present disclosure, are used for providing a further understanding of the present disclosure. Schematic embodiments of the present disclosure and descriptions thereof are used for explaining the disclosure and do not form improper limitations on the present disclosure.

FIG. 1 is a structural diagram of a method for fast and accurately sensing power grid information based on nonlinear robust estimation according to Embodiment 1 of the present disclosure;

DETAILED DESCRIPTION

Figure 2:
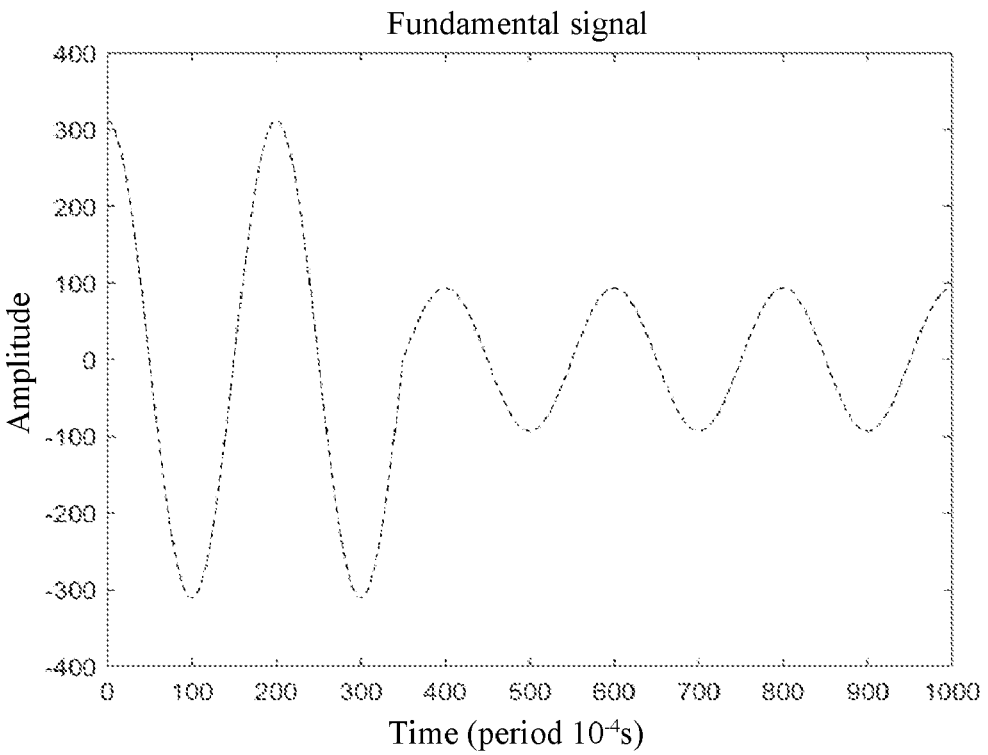
FIG. 2 shows a fundamental signal according to Embodiment 1 of the present disclosure.
Figure 3A:
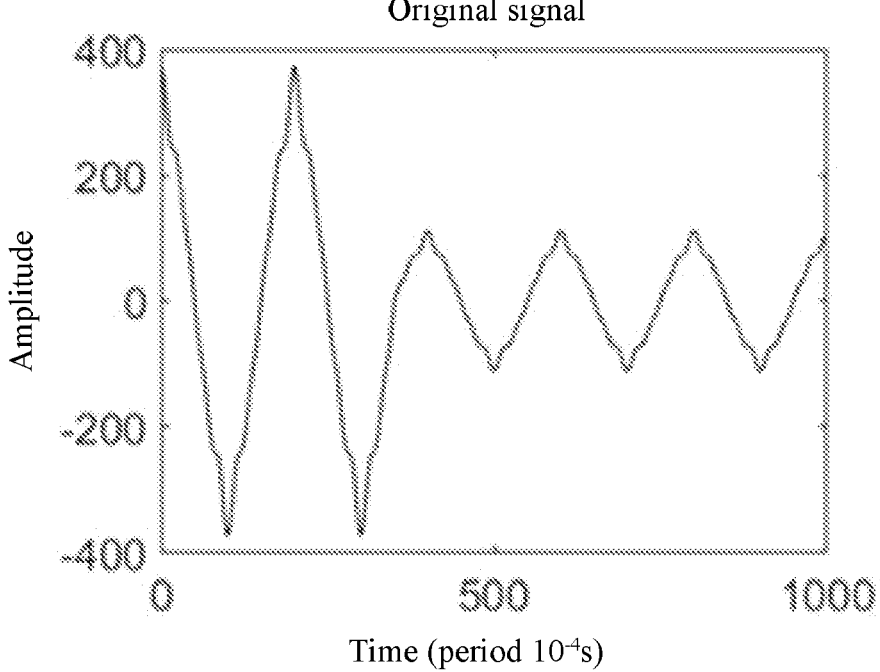
FIG. 3($a$) to FIG. 3($d$) show an original signal, a filtered signal, and errors between the original signal as well as the filtered signal and the fundamental signal.
Figure 3D:
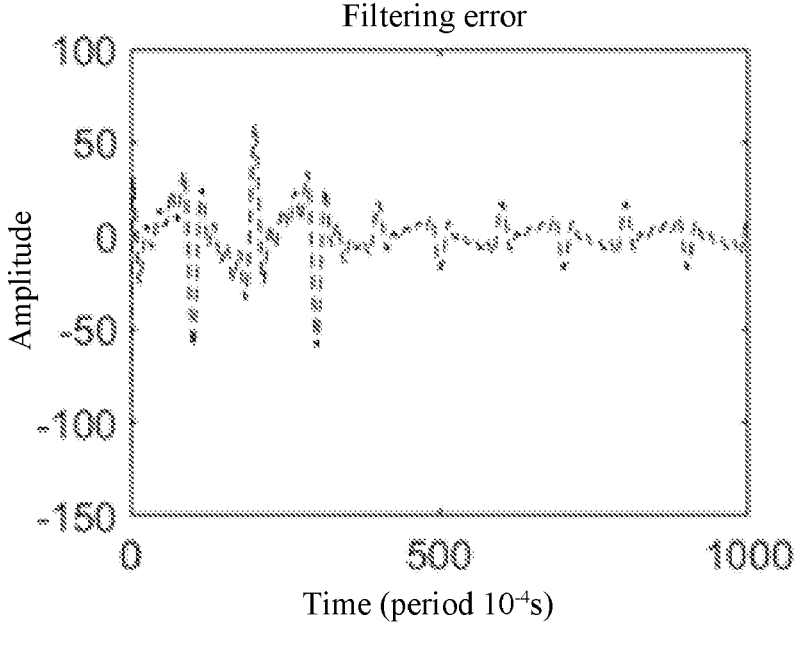
Figure 4A:
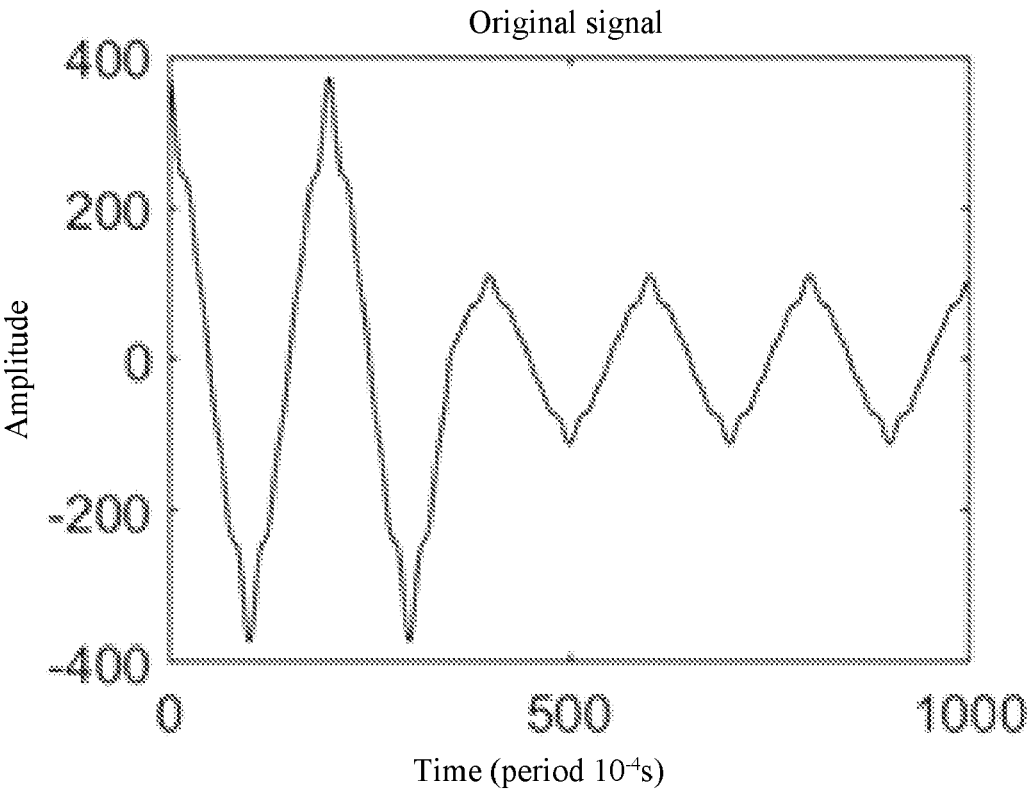
FIG. 4($a$) to FIG. 4($d$) show the original signal, five-step smoothing, and errors between the original signal as well as five-step smoothing and the fundamental signal.
Figure 4B:
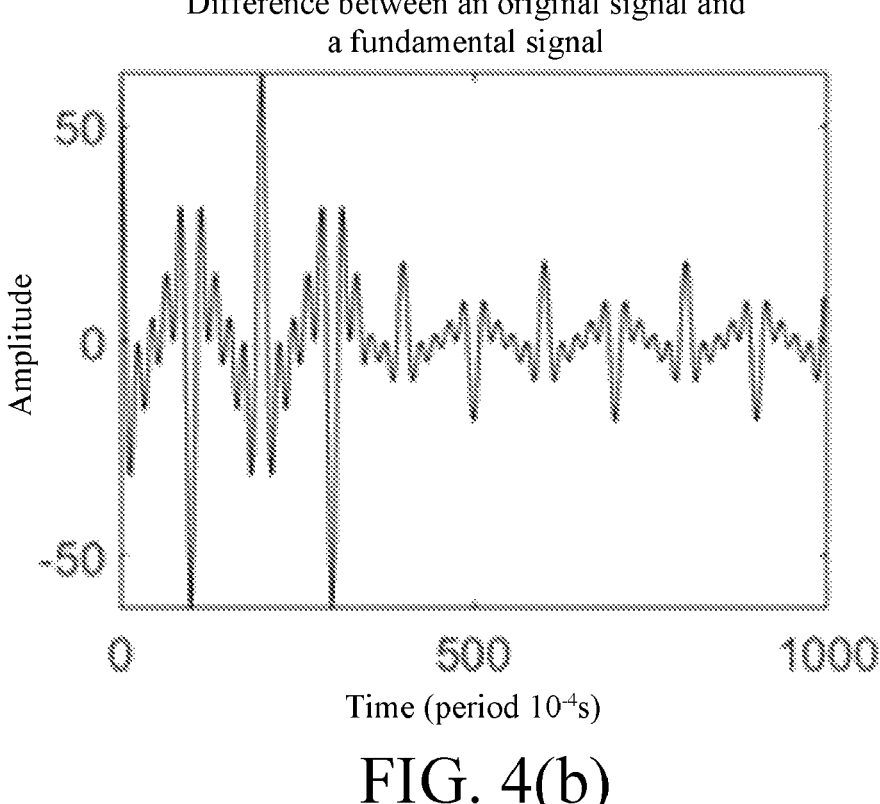
Figure 4C:
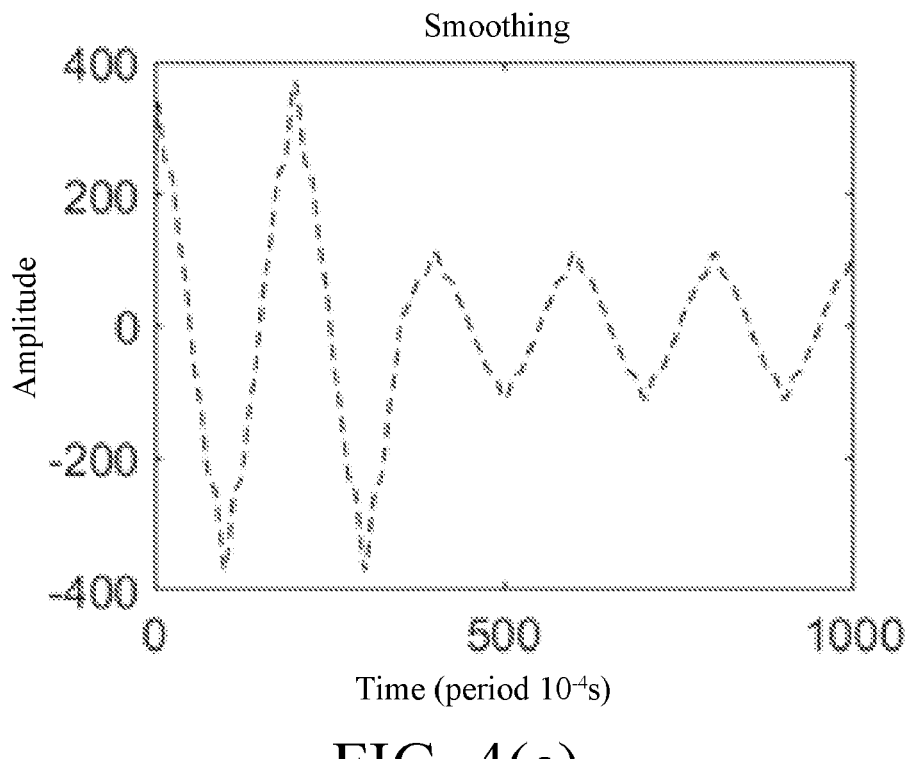
Figure 4D:
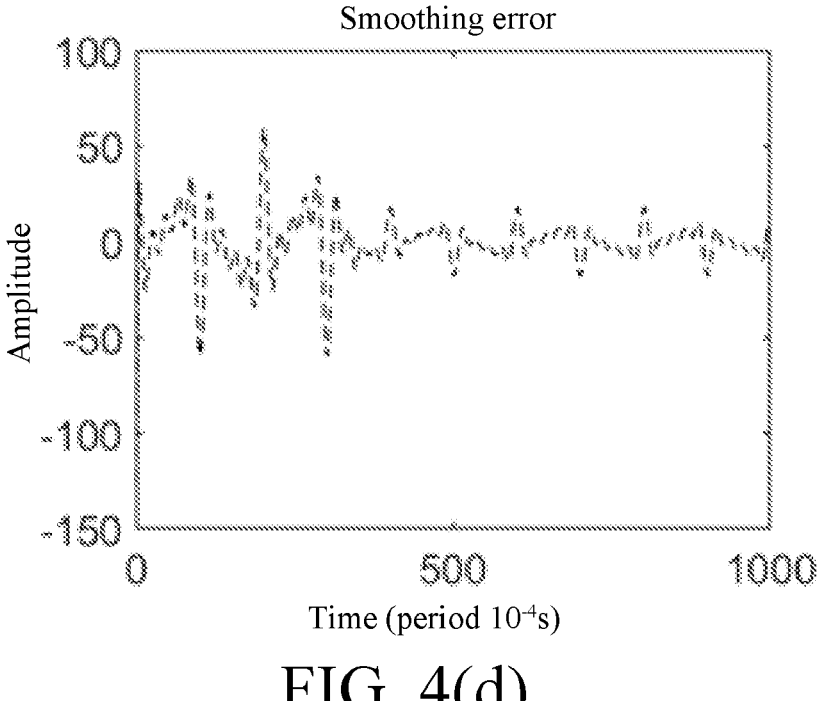

It is to be noted that the following detailed descriptions are all exemplary and intended to further describe the present disclosure. All technical and scientific terms used herein have the same meanings as commonly understood by those of ordinary skill in the technical art to which the present disclosure belongs, unless otherwise specified.

Embodiment

This embodiment provides a method for fast and accurately sensing power grid information based on nonlinear robust estimation.

As shown in FIG. 1, the method for fast and accurately sensing power grid information based on nonlinear robust estimation includes:

S101: acquiring a phase voltage signal of an actual power grid;

S102: Obtaining a nonlinear state-space distorted power grid model based on the phase voltage signal of the actual power grid and a virtual orthogonal signal of the phase voltage signal;

S103: establishing an H∞ smoothing estimation performance indicator based on the nonlinear state-space distorted power grid model, converting an H∞ smoothing estimation problem into a generalized $H_2$ smoothing estimation problem according to the H∞ smoothing estimation performance indicator, and constructing an H∞ smoothing estimator; and

S104: obtaining an initial sensed amplitude value and an initial sensed phase value of a power grid voltage signal by using the H∞ smoothing estimator, and performing zero-crossing detection on the initial sensed amplitude value and the initial sensed phase value of the power grid voltage signal to obtain sensed amplitude, frequency and phase values of a distorted voltage.

Further, the method further includes:

S105: controlling a grid-connected inverter based on the sensed amplitude, frequency and phase values of the distorted voltage.

Further, the converting H∞ smoothing estimation problem into the generalized $H_2$ smoothing estimation problem specifically includes: converting the H∞ smoothing estimation problem into the generalized $H_2$ smoothing estimation problem in a space mapping manner according to the H∞ smoothing estimation performance indicator.

Further, the constructing an H∞ smoothing estimator specifically includes: performing processing by using an output reconstruction method according to the generalized $H_2$ smoothing estimation problem to construct the H∞ smoothing estimator.

Further, the obtaining a nonlinear state-space distorted power grid model based on the phase voltage signal of the actual power grid and a virtual orthogonal signal of the phase voltage signal in S102 specifically includes:

The phase voltage signal v of the actual power grid and the virtual orthogonal signal u of the phase voltage signal are represented as sums of a series of harmonics, defined as:

$$\begin{cases} v = \sum_{h=0} v_h = \sum_{h=0} V_h \cos\theta_h = \sum_{h=0} V_h \cos(h\omega t + \varphi_h) \\ u = \sum_{h=0} u_h = \sum_{h=0} V_h \sin\theta_h = \sum_{h=0} V_h \sin(h\omega t + \varphi_h) \end{cases}, \quad (1)$$

where h represents a harmonic component order, $V_h$ represents an amplitude of an $h^{th}$ harmonic component, $\theta_h$ represents a phase angle of the $h^{th}$ harmonic component, $\varphi_h$ represents an initial phase angle of the $h^{th}$ harmonic component, $\omega$ represents an angular frequency of the actual power grid, t represents running time, $v_h$ represents an $h^{th}$ harmonic component of the phase voltage signal v of the power grid, and $u_h$ represents an $h^{th}$ harmonic component of the virtual orthogonal signal u.

The $h^{th}$ harmonic components are represented as:

$$\begin{bmatrix} \dot{v}_h \\ \dot{u}_h \end{bmatrix} = \begin{bmatrix} 0 & -h\omega \\ h\omega & 0 \end{bmatrix} \begin{bmatrix} v_h \\ u_h \end{bmatrix}, \quad (2)$$

where $\dot{v}_h$ represents a derivative of $v_h$, and $u_h$ represents a derivative of $u_h$; $\omega$ is an intermediate variable, and it is complex to estimate $\omega$, so that $\Omega$ is set as a frequency parameter to be estimated, and the following equations are defined:

$$\Omega = \frac{\omega^2}{\varpi}, \quad (3\text{-}1)$$

$$\psi_h = \frac{\varpi}{\omega} u_h, \quad (3\text{-}2)$$

where $\psi_h$ represents a corrected virtual orthogonal signal, and $u_h$ represents an actual virtual orthogonal signal.

then, $$\begin{bmatrix} \dot{v}_h \\ \dot{\psi}_h \end{bmatrix} = \begin{bmatrix} 0 & -h\Omega \\ h\varpi & 0 \end{bmatrix} \begin{bmatrix} v_h \\ \psi_h \end{bmatrix}, \quad (4)$$

where $\varpi$ represents a set initial power grid frequency, and a sign with "⁻" above represents a derivative of a variable.

A fundamental signal of a phase voltage is extracted, an orthogonal signal is constructed, and if a sampling period T is short enough, the formula (4) is discretized as:

$$\frac{x_0(k+1) - x_0(k)}{T} = \begin{bmatrix} 0 & 0 \\ \varpi & 0 \end{bmatrix} x_0(k) + \begin{bmatrix} 0 & -1 \\ 0 & 0 \end{bmatrix} x_0(k)\Omega + w_0(k), \qquad (5)$$

where $$x_0(k) = \begin{bmatrix} x_{01}(k) \\ x_{02}(k) \end{bmatrix} = \begin{bmatrix} v(k) \\ \psi(k) \end{bmatrix},$$

and $w_0(k)$ represents a hypothetical process noise.

If $$\Omega(k+1) = \Omega(k) + w_1(k), \qquad (6)$$

where $w_1(k)$ represents a hypothetical process noise, based on the formula (5) and the formula (6), a state equation is redescribed as:

$$\begin{bmatrix} x_1(k+1) \\ x_2(k+1) \\ x_3(k+1) \end{bmatrix} = \begin{bmatrix} 1 & 0 & 0 \\ T\varpi & 1 & 0 \\ 0 & 0 & 1 \end{bmatrix} + \begin{bmatrix} -T \\ 0 \\ 0 \end{bmatrix} x_2(k)x_3(k) + w(k), \qquad (7)$$

where $$x(k) = \begin{bmatrix} x_1(k) \\ x_2(k) \\ x_3(k) \end{bmatrix} = \begin{bmatrix} v(k) \\ \psi(k) \\ \Omega(k) \end{bmatrix},$$

and $w(k)$ represents a hypothetical process noise.

Further, a first observation equation is constructed:

$$yx_1(k) = [\,1 \quad 0 \quad 0\,]x(k) + v_1(k), \qquad (8)$$

where $yx_1(k)$ represents an observed value, and $v_1(k)$ represents an observed noise.

If an ideal voltage signal is:

$$\alpha(k) = A\cos(2\pi wkT)$$

$$\beta(k) = A\sin(2\pi wkT)$$

then a second observation equation is:

$$yx_2(k) = \frac{a\tan\left(\dfrac{\beta(k)}{\alpha(k)}\right)}{2\pi kT} = [\,0 \quad 0 \quad 1\,]x(k) + v_2(k), \qquad (9)$$

where $yx_2(k)$ represents an observed value, and $v_2(k)$ represents an observed noise.

Based on the above discussion, a phase voltage model is represented as follows:

$$\begin{cases} x(k+1) = Ax(k) + B\emptyset(x(k)) + w(k) \\ \quad y(k) = Cx(k) + v(k) \\ \quad\quad z(k) = Lx(k) \\ \quad\quad x(0) = x_0 \end{cases}, \qquad (10)$$

where $$A = \begin{bmatrix} 1 & 0 & 0 \\ T\varpi & 1 & 0 \\ 0 & 0 & 1 \end{bmatrix}, B = \begin{bmatrix} -T \\ 0 \\ 0 \end{bmatrix}, C = \begin{bmatrix} 1 & 0 & 0 \\ 0 & 0 & 1 \end{bmatrix},$$

$$y(k) = \begin{bmatrix} yx_1(k) \\ yx_2(k) \end{bmatrix}, v(k) = \begin{bmatrix} v_1(k) \\ v_2(k) \end{bmatrix},$$

$x_0$ represents an initial state of $x(k)$, L represents a unit matrix, and $z(k)$ is a signal to be sensed.

$\emptyset(x(k)) = x_2(k)x_3(k)$ is a nonlinear term satisfying the following Lipschitz condition:

$$\|\emptyset(x(k)) - \emptyset(\hat{x}(k))\| \le \gamma_1\|F(x(k) - \hat{x}(k))\|, \qquad (11)$$

where $\gamma_1$ and F respectively represent a Lipschitz constant and a constant matrix, and $\hat{x}(k)$ represents a state estimate of $x(k)$.

Further, the nonlinear state-space distorted power grid model is a Lipschitz nonlinear system model.

Further, the establishing an H∞ smoothing estimation performance indicator based on the nonlinear state-space distorted power grid model in S103 specifically includes:

if the H∞ estimation performance indicator is a given scalar $\gamma > 0$, a smoothing step number $l \ge 0$, and an observation sequence $$\{y(i)\}_{i=0}^{k},$$

seeking for an estimator $\check{z}(k_l|k)$ $(k_l = k - l)$ satisfying the performance indicator for a signal $z(k)$:

$$\sup_{(x_0, w, v) \ne 0} \frac{\sum_{k=0}^{N}\|\check{z}(k_l \,|\, k) - z(k)\|^2}{\|x_0 - \check{x}_0\|_{P_0^{-1}}^2 + \sum_{k=0}^{N}\|w(k)\|^2 + \sum_{k=0}^{N}\|v(k)\|^2} < \gamma^2 \qquad (12)$$

where $\check{x}_0$ and $P_0$ respectively represent a given state estimate initial value and a positive definite matrix.

Further, the converting an H∞ smoothing estimation problem into a generalized $H_2$ smoothing estimation problem according to the H∞ smoothing estimation performance indicator and constructing an H∞ smoothing estimator in S103 specifically includes:

S1031: setting an H∞ indicator upper limit constant $\gamma > 0$, a moment $i = k_l = 0$, a state estimate initial value $\check{x}_0 = 0$, and a Riccati equation initial value $P_0 = l$, N being a specific time point:

$$C_2 = [\, C^T \quad F^T \quad L^T \,]^T$$
$$Q_2(i) = \mathrm{diag}\{I, \, -\gamma_1^{-2}I, \, -\gamma^2 I\}$$
$$\tilde{y}_2(i, 2) = y_2(i) - C_2\hat{x}(i, 2)$$
$$y_2(i) = \left[\, y^T(i) \quad \breve{z}_\emptyset^T(i\,|\,i) \quad \breve{z}^T(i\,|\,i+l) \,\right]^T$$
, and calculating
a second-piece output error variance $R_2(i,2)$:

$$R_2(i, 2) = C_2 P_2(i) C_2^T + Q_2(i), \tag{13}$$

a second-piece gain parameter $K_2(i)$:

$$K_2(i) = A P_2(i) C_2^T R_2^{-1}(i, 2), \tag{14}$$

a second-piece Riccati equation $P_2(i+1)$:

$$P_2(i+1) = A P_2(i) A^T + B B^T + I - K_2(i) R_2(i, 2) K_2^T(i) \tag{15-1}$$
$$P_2(0) = P_0, \tag{15-2}$$

and
a second-piece state estimation equation $\hat{x}(i+1,2)$:

$$\hat{x}(i+1, 2) = A\hat{x}(i, 2) + \emptyset\big(\breve{x}(i\,|\,i)\big) + K_2(i)\tilde{y}_2(i, 2) \tag{16-1}$$
$$\hat{x}(0, 2) = \breve{x}_0; \tag{16-2}$$

S1032: setting a first-piece initial state value $\hat{x}(i, 1)=\hat{x}(i, 2)$ and a first-piece Riccati equation initial value $P_1(i) = P_2(i)$, and calculating
a zeroth-piece output error variance $R_0(i)$:

$$R_0(i) = C P_1(i) C^T + I, \tag{17}$$

a zeroth-piece state gain parameter $K_0(i)$:

$$K_0(i) = F P_1(i) C^T R_0^{-1}(i), \tag{18}$$

and
an estimation error variance $R_\emptyset(i|i)$ of a virtual output $\breve{z}_\emptyset$:

$$R_\emptyset(i\,|\,i) = F P_1(i) F^T - \gamma_1^{-2}I - K_0(i) R_0(i) K_0^T(i); \tag{19}$$

S1033: if $R_0(i)>0$ and $R_\emptyset(i|i)<0$ are satisfied, calculating an estimation equation $\breve{z}_\emptyset(i|i)$ of the virtual output $\breve{z}_\emptyset$:

$$\breve{z}_\emptyset(i\,|\,i) = F\hat{x}(i, 1) + K_0(i)\tilde{y}_0(i), \tag{20}$$

where
a zeroth-piece output estimation error $\tilde{y}_0(i)$ is:

$$\tilde{y}_0(i) = y(i) - C\hat{x}(i, 1)$$

further performing S1034; or
if $R_0(i)>0$ and $R_\emptyset(i|i)<0$ are not satisfied, resetting the value of $\gamma$, and performing S1031;

S1034: setting an initial value of a smoothing gain parameter to be $$R_{x,k_l}^{k_l} = P_1(k_l),$$

$$C_1 = [\, C^T \quad F^T \,]^T$$
$$Q_1(k_l) = \mathrm{diag}\{I, \, -\gamma_1^{-2}I\}$$
, calculating
a first-piece output error variance $R_1(k_l, 1)$:

$$R_1(k_l, 1) = C_1 P_1(k_l) C_1^T + Q_1(k_l), \tag{21}$$

and
a filtering estimation error variance $R_z(k_l|k_l)$ of a signal to be estimated:

$$R_z(k_l\,|\,k_l) = L P_1(k_l) L^T - \gamma^2 I - K_z(k_l) R_1(k_l, 1) K_z^T(k_l), \tag{22}$$

where $$K_z(k_l) = L P_1(k_l) C_1^T R_1^{-1}(k_l, 1)$$

if $R_2(k_l|k_l)<0$, calculating an H∞ filtering estimate $\breve{z}(k_l|k_l)$:

$$\breve{z}(k_l\,|\,k_l) = L\hat{x}(k_l, 1) + L R_{x,k_l}^{k_l} C_1^T R_1^{-1}(k_l, 1)\tilde{y}_1(k_l, 1), \tag{23}$$

where
a first-piece output estimation error $\tilde{y}_1(k_l, 1)$ and an output signal $y_1(k_l)$ are as follows:

$$\tilde{y}_1(k_l, 1) = y_1(k_l) - C_1\hat{x}(k_l, 1)$$
$$y_1(k_l) = \left[\, y^T(k_l) \quad \breve{z}_\emptyset^T(k_l\,|\,k_l) \,\right]^T$$

further performing S1035; or if $R_z(k_l|k_l)<0$ is not satisfied, resetting the value of $\gamma$, and performing S1031;

S1035: setting i=i+1, calculating $R_1(i, 1)$ according to (21), calculating a first-piece state gain parameter $K_1(i)$:

$$K_1(i) = AP_1(i)C_1^T R_1^{-1}(i, 1), \qquad (24)$$

a first-piece Riccati equation $P_1(i+1)$:

$$P_1(i+1) = AP_1(i)A^T + BB^T + I - K_1(i)R_1(i, 1)K_1^T(i) \qquad (25)$$

$$P_1(k_l) = P_2(k_l), \text{ and}$$

a first-piece state estimation equation $\hat{x}(i+1,1)$:

$$\hat{x}(i+1, 1) = A\hat{x}(i, 1) + \phi\big(\bar{x}(i\,|\,i)\big) + K_1(i)\tilde{y}_1(i, 1), \qquad (26)$$

$$\hat{x}(k_l, 1) = \hat{x}(k_l, 2)$$

calculating $R_0(i)$, $K_0(i)$, and $R_\varnothing(i|i)$ according to formulas (17) to (19), and if $R_0(i)>0$ and $R_\varnothing(i|i)<0$, calculating $\check{z}_\varnothing(i|i)$ according to (20), and performing S1036; or if $R_0(i)>0$ and $R_\varnothing(i|i)<0$ are not satisfied, resetting the value of $\gamma$, and performing S1031;

S1036: calculating the smoothing gain parameter $$R_{x,k_l}^i:$$

$$\begin{cases} R_{x,k_l}^i = R_{x,k_l}^{i-1}(A - K_1(i-1)C_1)^T \\ R_{x,k_l}^{k_l} = P_1(k_l) \end{cases}, \qquad (27)$$

and a smoothing estimation error variance $R_z(k_l|i)$:

$$R_z(k_l\,|\,i) = \qquad (28)$$

$$LP_1(k_l)L^T - \gamma^2 I - K_z(k_l)R_1(k_l, 1)K_z^T(k_l) - \sum_{j=k_l+1}^{i} R_{k_l}^j R_1(j, 1)\big(R_{k_l}^j\big)^T,$$

where $$R_{k_l}^j = LR_{x,k_l}^j C_1^T R_1^{-1}(j, 1),$$

if $R_z(k_l|i)<0$, calculating an H∞ smoothing estimate $\check{z}(k_l|i)$:

$$\check{z}(k_l\,|\,i) = \hat{z}(k_l\,|\,i-1) + LR_{x,k_l}^i C_1^T R_1^{-1}(i, 1)\tilde{y}_1(i, 1); \qquad (29)$$

or if $R_z(k_l|i)<0$ is not satisfied, resetting the value of $\gamma$, and performing S1031;

S1037: repeating S1035 to S1036 until i=k; and

S1038: setting k=k+1, and repeating S1031 to S1037 until k=N.

Further, the H∞ smoothing estimator is a Riccati-equation-based recursive H∞ smoothing estimator.

Further, the obtaining an initial sensed amplitude value and an initial sensed phase value of a power grid voltage signal by using the H∞ smoothing estimator and performing zero-crossing detection on the initial sensed amplitude value and the initial sensed phase value of the power grid voltage signal to obtain sensed amplitude, frequency and phase values of a distorted voltage in S104 specifically includes:

determining, according to whether adjacent signals are opposite in sign, whether zero is crossed; and using a first zero-crossing point as a frequency determining standard, and using an amplitude of a zero-crossing point as an amplitude in a first half of a period.

It is to be understood that since the signal is a discrete signal, and may not cross zero everywhere, whether zero is crossed is determined according to whether adjacent signals are opposite in sign. Since the signal may jitter at a zero-crossing point under the impact of a noise, a harmonic and the like, but H∞ filtering processing has weaken or eliminate the jitter, the first zero-crossing point is used as the frequency determining standard.

Like the frequency, the amplitude is affected by the noise and the harmonic, and fluctuates all the time, which greatly affects a sinusoidal waveform. Therefore, the amplitude of the zero-crossing point is used as the amplitude in the first half of the period to correct the waveform.

Further, the controlling a grid-connected inverter based on the sensed amplitude, frequency and phase values of the distorted voltage in S105 refers to ensuring in current loop control of the inverter that a phase difference between an output current and a grid-side fundamental voltage is 0, so as to implement grid connection under a unit power factor.

A basic principle of the present disclosure is that an H∞ problem is converted into an $H_2$ problem, that is, converted into a generalized Kalman filtering problem, by using a space mapping technology based on an established Lipschitz nonlinear model, and further, an H∞ filter and a smoothing estimator are designed by using an output reconstruction method to perform zero-crossing point detection on a signal to be estimated to sense a phase and an amplitude of a fundamental component.

The method is suitable for a power grid signal whose frequency changes slowly, is an efficient power grid voltage amplitude/frequency/phase sensing technology capable of fast sensing a frequency and an amplitude, and helps determine a failure such as frequency change and voltage drop.

In a robust nonlinear amplitude/frequency/phase sensor process proposed in the present disclosure, both an H∞ filtering problem and a smoothing problem are considered. In an experiment or a simulation process, H∞ filtering estimation or smoothing estimation is selected according to requirements for accuracy and high speed. In addition, an estimator algorithm is specifically described in SUMMARY.

Simulation Results:

modeling simulation is performed, by using MATLAB, on a method for robust nonlinear sensing of an amplitude/frequency/phase of a distorted power grid. A sampling frequency is set to 10 kHz, and a distorted signal is as follows:

$$v(i) = \begin{cases} H_0 \cos(100\pi iT) + H_1 \cos(300\pi iT) + & i \le 350 \\ H_1 \cos(500\pi iT) + H_1 \cos(700\pi iT) + \\ \qquad H_1 \cos(900\pi iT) \\ 0.3 H_0 \cos(100\pi iT) + 0.3 H_1 \cos(300\pi iT) + & i > 350 \\ 0.3 H_1 \cos(500\pi iT) + 0.3 H_1 \cos(700\pi iT) + \\ \qquad 0.3 H_1 \cos(900\pi iT) \end{cases}$$

$H_0 = 311V$. $H_1 = 0.05 \times H_0$, and $T = 10^{-4}$ s. A fundamental wave (as shown in FIG. 2) of the distorted signal is estimated by using the space mapping technology based on a nonlinear model (10).

FIG. 3(a) to FIG. 3(d) show simulation results obtained by a filter designed by using the space mapping technology and a projection formula. It can be seen from the simulation results that a filtering technology has a denoising function, an effect in sensing v (i) is good, but the fundamental signal cannot be completely extracted.

FIG. 4(a) to FIG. 4(d) show simulation results obtained by a five-step smoother (l=5) designed by using the space mapping technology, the output reconstruction method, and a projection formula. It can be seen from the simulation results that a smoothing technology has a denoising function, an effect in sensing v(i) is good, but the fundamental signal cannot be completely extracted.

Figure 5:
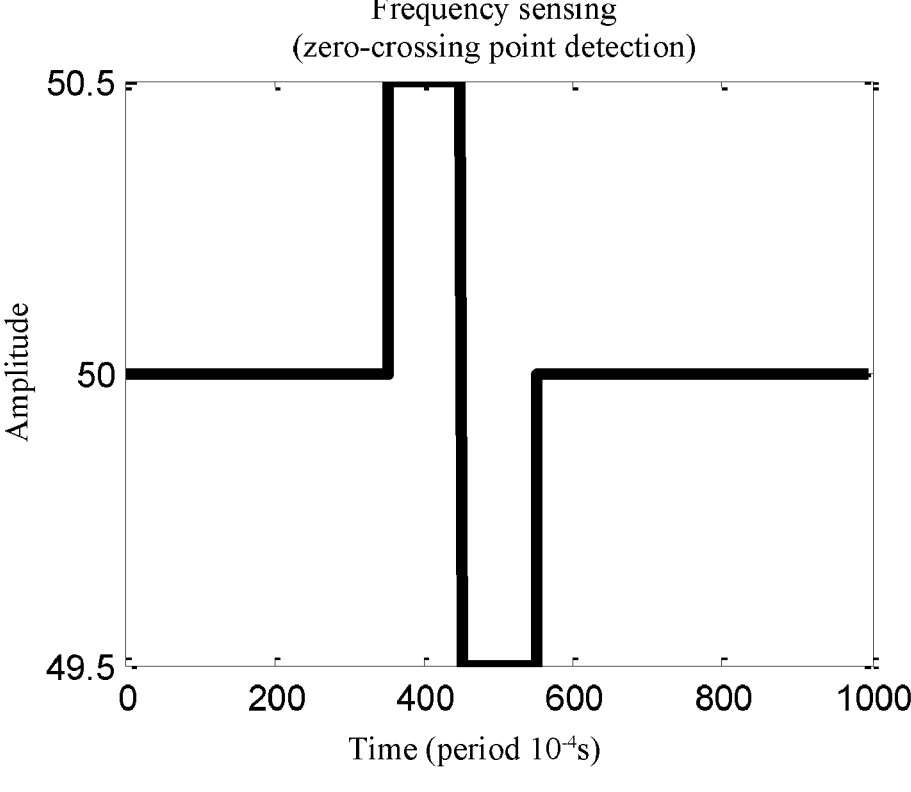
FIG. 5 shows frequency sensing (zero-crossing point detection) according to Embodiment 1 of the present disclosure.
Figure 6A:
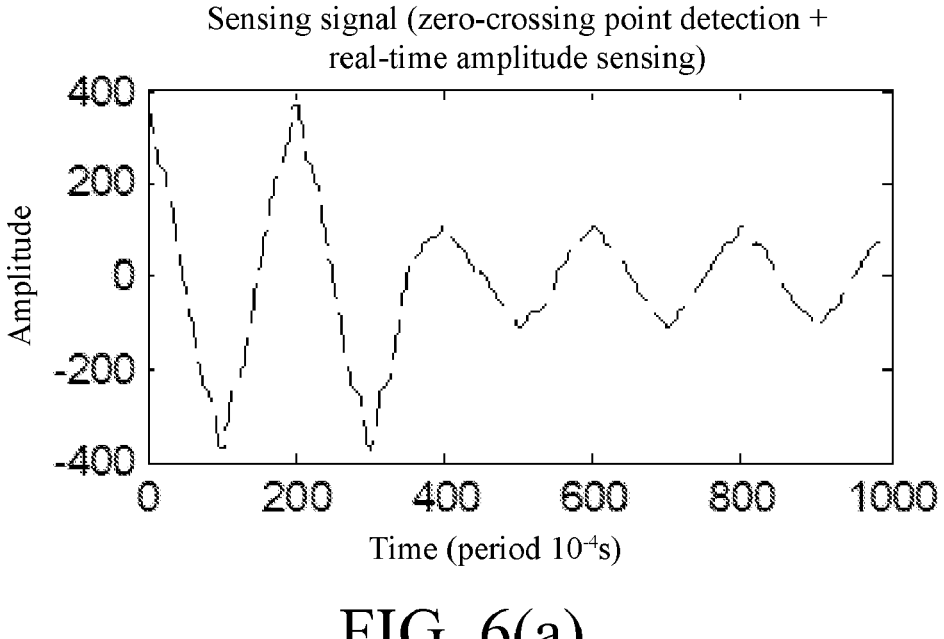
FIG. 6($a$) to FIG. 6($d$) show a sensing signal and error (zero-crossing point frequency detection+real-time amplitude sensing) and a sensing signal and error (zero-crossing point frequency detection+zero-crossing point amplitude sensing) according to Embodiment 1 of the present disclosure.
Figure 6B:
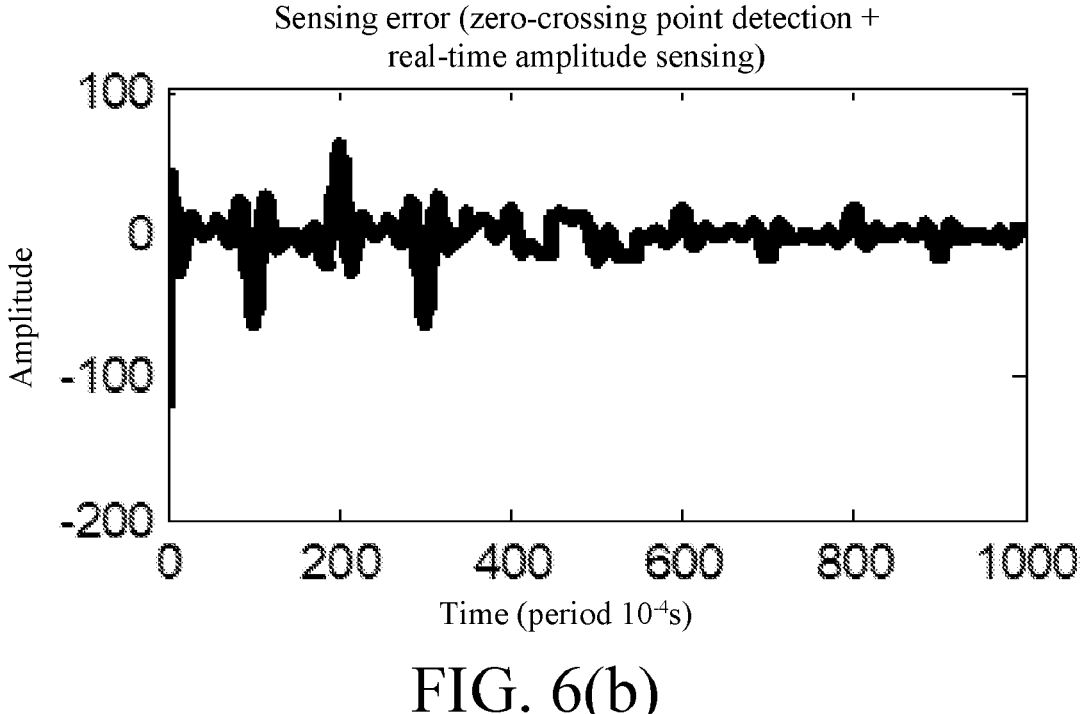
Figure 6C:
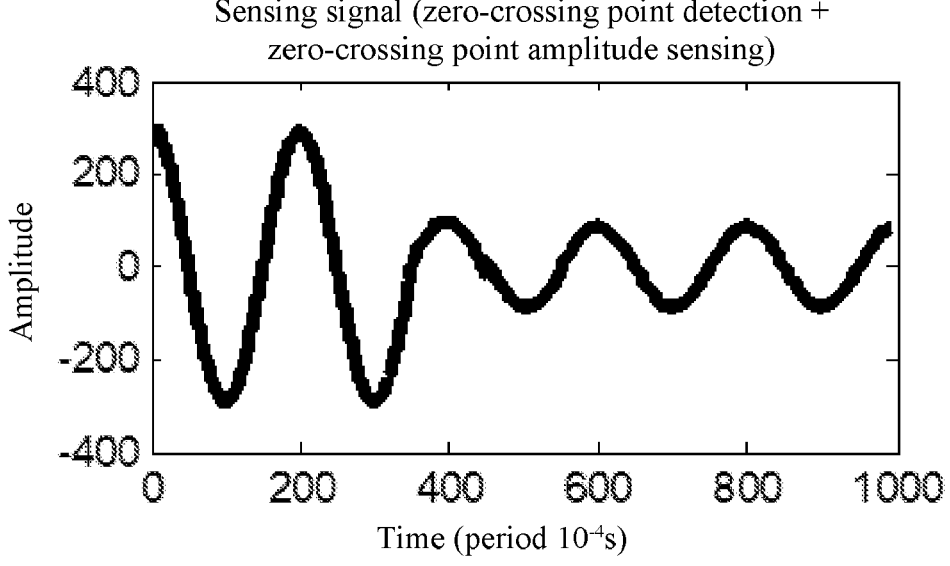
Figure 6D:
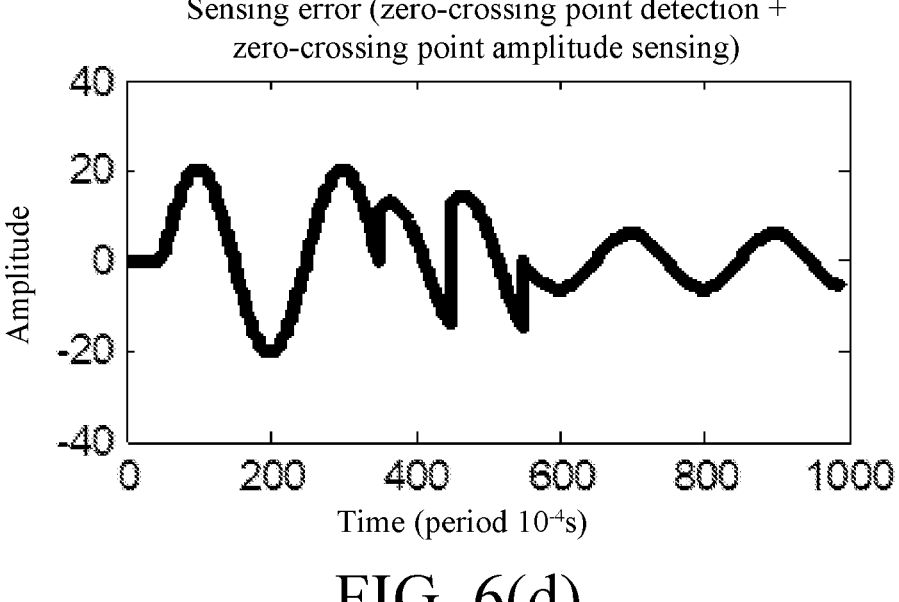

FIG. 5 shows an estimated frequency value obtained by performing zero-crossing point detection on a signal to be subjected to smoothing estimation. It can be seen that a frequency value can be well sensed by the algorithm, and the frequency jitters when the amplitude of the voltage attenuates greatly.

FIG. 6(a) to FIG. 6(d) respectively simulate a fundamental sensing signal and error in case of using zero-crossing point frequency detection and real-time amplitude sensing and a fundamental sensing signal and error in case of using zero-crossing point frequency detection and zero-crossing point amplitude sensing. It is apparent from a sensed waveform and an error waveform that the fundamental signal can be tracked more accurately by using zero-crossing point frequency detection and zero-crossing point amplitude sensing.

In the present disclosure, according to the distorted power grid model, the fundamental signal of the signal is extracted and the orthogonal signal is constructed, and mechanism analysis and discretizing are performed to establish a type of Lipschitz nonlinear space-state model. H∞ filtering and smoothing estimation performance indicators are proposed, and a Riccati-equation-based recursive filtering and smoothing estimator is constructed by using a space projection technology and the output reconstruction method to preliminarily sense the amplitude and the phase of the voltage signal. Zero-crossing point detection is performed on the preliminarily sensed voltage signal to obtain the sensed amplitude/frequency/phase value of the fundamental signal in the distorted voltage. According to the method, a nonlinear robust estimator is designed by using the space mapping technology based on the distorted power grid model, without dependence on a conventional linearization method, and integrity of the signal is ensured.

The above is only the preferred embodiments of the present disclosure and not intended to limit the present disclosure. Those skilled in the art may make various modifications and variations to the present disclosure. Any modification, equivalent replacement, improvement, and the like made within the spirit and principle of the present disclosure shall fall within the protection scope of the present disclosure.

What is claimed is:

1. A method for sensing power grid information based on nonlinear robust estimation, comprising:

acquiring a phase voltage signal of an actual power grid;

obtaining a nonlinear state-space distorted power grid model based on the phase voltage signal of the actual power grid and a virtual orthogonal signal of the phase voltage signal;

establishing an H∞ smoothing estimation performance indicator based on the nonlinear state-space distorted power grid model, converting an H∞ smoothing estimation problem into a generalized $H_2$ smoothing estimation problem according to the H∞ smoothing estimation performance indicator, and constructing an H∞ smoothing estimator;

obtaining an initial sensed amplitude value and an initial sensed phase value of a power grid voltage signal by using the H∞ smoothing estimator, and performing zero-crossing point detection on the initial sensed amplitude value and the initial sensed phase value of the power grid voltage signal to obtain sensed amplitude, frequency and phase values of a distorted voltage; and based on the obtained sensed amplitude, frequency and phase values of the distorted voltage, controlling a phase difference between an output current in a current loop control of the grid-connected inverter and a grid-side fundamental voltage to be 0, to implement a grid connection under a unit power factor;

wherein, the converting the H∞ smoothing estimation problem into the generalized $H_2$ smoothing estimation problem according to the H∞ smoothing estimation performance indicator and constructing the H∞ smoothing estimator specifically comprises:

(1) setting an H∞ indicator upper limit constant $\gamma > 0$, a sampling moment $i = k_f = 0$, a state estimate initial value $\check{x}_0 = 0$, and a Riccati equation initial value $P_0 = 1$, N being a specific time point:

$$\begin{aligned} C_2 &= \begin{bmatrix} C^T & F^T & L^T \end{bmatrix}^T \\ Q_2(i) &= \mathrm{diag}\{I, \ -\gamma_1^{-2}I, \ -\gamma^2 I\} \\ \tilde{y}_2(i, 2) &= y_2(i) - C_2\hat{x}(i, 2) \\ \tilde{y}_2(i, 2) &= \begin{bmatrix} y^T(i) & \check{z}_\phi^T(i|i) & \check{z}^T(i|i+l) \end{bmatrix}^T \end{aligned} \quad \text{, and}$$

wherein, $$C = \begin{bmatrix} 1 & 0 & 0 \\ 0 & 0 & 1 \end{bmatrix},$$

F represents a constant matrix of the nonlinear portion in the phase voltage model, and L represents a unit matrix; Q represents a diagonal matrix constructed based on diag{ } function, $\gamma_1$ represents a Lipschitz constant of a nonlinear portion in a phase voltage model; $\tilde{y}_2(i, 2)$ represents an observed estimation error, $\hat{x}(i, 2)$ is a second-piece initial state value; y(i) is an observation sequence, $\check{z}_\phi(i|i)$ is an estimation equation of the virtual output $\check{z}_\phi$; $\check{z}(k_f|k)$ is an estimator of the signal z(k), wherein $k_f = k-l$, when let the sampling moment $i = k_f = 0$, it can be written as $\check{z}(i|i+l)$; i represents a first sampling moment, k represents a second sampling moment, l is a smoothing step number, and the superscript T represents transposed matrix;

calculating:

a second-piece output error variance $R_2(i, 2)$:

$$R_2(i, 2) = C_2 P_2(i) C_2^T + Q_2(i), \qquad (13)$$

wherein $P_2(i)$ represents a second-piece Riccati equation value;

a second-piece gain parameter $K_2(i)$:

$$K_2(i) = A P_2(i) C_2^T R_2^{-1}(i, 2), \qquad (14)$$

wherein, $$A = \begin{bmatrix} 1 & 0 & 0 \\ T\bar{\omega} & 1 & 0 \\ 0 & 0 & 1 \end{bmatrix},$$

T represents a sampling period, and w represents a set initial power grid frequency;

a second-piece Riccati equation $P_2(i+1)$:

$$P_2(i+1) = A P_2(i) A^T + B B^T + I - K_2(i) R_2(i, 2) K_2^T(i) \qquad (15\text{--}1)$$

$$P_2(0) = P_0, \qquad (15\text{--}2)$$

wherein, $$B = \begin{bmatrix} -T \\ 0 \\ 0 \end{bmatrix};$$

and, a second-piece state estimation equation $\hat{x}(i+1, 2)$:

$$\hat{x}(i+1, 2) = A\hat{x}(i, 2) + \emptyset(\bar{x}(i \mid i)) + K_2(i)\bar{y}_2(i, 2) \qquad (16\text{--}1)$$

$$\hat{x}(0, 2) = \bar{x}_0; \qquad (16\text{--}2)$$

wherein, Ø represents a nonlinear term;

(2) setting a first-piece initial state value $\hat{x}(i, 1) = \hat{x}(i, 2)$ and a first-piece Riccati equation initial value $P_1(i) = P_2(i)$, and calculating:

a zeroth-piece output error variance $R_0(i)$:

$$R_0(i) = C P_1(i) C^T + I, \qquad (17)$$

a zeroth-piece state gain parameter $K_0(i)$:

$$K_0(i) = F P_1(i) C^T R_0^{-1}(i), \qquad (18)$$

and, an estimation error variance $R_\varnothing(i \mid i)$ of a virtual output $\check{z}_\varnothing$:

$$R_\varnothing(i \mid i) = F P_1(i) F^T - \gamma_1^{-2} I - K_0(i) R_0(i) K_0^T(i); \qquad (19)$$

(3) if $R_0(i) > 0$ and $R_\varnothing(i \mid i) < 0$ are satisfied, calculating:

an estimation equation $\check{z}_\varnothing(i \mid i)$ of the virtual output $\check{z}_\varnothing$:

$$\check{z}_\varnothing(i \mid i) = F\hat{x}(i, 1) + K_0(i)\bar{y}_0(i), \qquad (20)$$

wherein, a zeroth-piece output estimation error $\bar{y}_0(i)$ is:

$$\bar{y}_0(i) = y(i) - C\hat{x}(i, 1)$$

further performing (4); or:

if $R_0(i) > 0$ and $R_\varnothing(i \mid i) < 0$ are not satisfied, resetting the value of $\gamma$, and performing (1);

(4) setting an initial value of a smoothing gain parameter to be $$R_{x,k_l}^{k_l} = P_1(k_l),$$

wherein $P_1(k_l)$ represents a Riccati equation obtained in an estimator design process, $$C_1 = [\, C^T \quad F^T \,]^T$$
$$Q_1(k_l) = \mathrm{diag}\{I, -\gamma_1^{-2} I\},$$

calculating:

a first-piece output error variance $R_1(k_l, 1)$:

$$R_1(k_l, 1) = C_1 P_1(k_l) C_1^T + Q_1(k_l), \qquad (21)$$

and, a filtering estimation error variance $R_z(k_l \mid k_l)$ of a signal to be estimated:

$$R_z(k_l \mid k_l) = L P_1(k_l) L^T - \gamma^2 I - K_z(k_l) R_1(k_l, 1) K_z^T(k_l), \qquad (22)$$

wherein, $$K_z(k_l) = L P_1(k_l) C_1^T R_1^{-1}(k_l, 1)$$

if $R_z(k_l \mid k_l) < 0$, calculating an H∞ filtering estimate $\check{z}(k_l \mid k_l)$:

$$\check{z}(k_l \mid k_l) = L\hat{x}(k_l, 1) + L R_{x,k_l}^{k_l} C_1^T R_1^{-1}(k_l, 1)\bar{y}_1(k_l, 1), \qquad (23)$$

wherein, a first-piece output estimation error $\tilde{y}_1(k_l, 1)$ and an output signal $y_1(k_l)$ are as follows:

$$\tilde{y}_1(k_l, 1) = y_1(k_l) - C_1\hat{x}(k_l, 1)$$

$$y_1(k_l) = \begin{bmatrix} y^T(k_l) & \bar{z}_\phi^T(k_l \mid k_l) \end{bmatrix}^T$$

further performing (5); or:

if $R_z(k_l \mid k_l) < 0$ is not satisfied, resetting the value of $\gamma$, and performing (1);

(5) setting i=i+1, calculating $R_1(i, 1)$ according to (21), calculating:

a first-piece state gain parameter $K_1(i)$:

$$K_1(i) = AP_1(i)C_1^T R_1^{-1}(i, 1), \tag{24}$$

a first-piece Riccati equation $P_1(i+1)$:

$$P_1(i+1) = AP_1(i)A^T + BB^T + I - K_1(i)R_1(i, 1)K_1^T(i) \tag{25}$$

$$P_1(k_l) = P_2(k_l), \text{ and}$$

and, a first-piece state estimation equation $\hat{x}(i+1,1)$:

$$\hat{x}(i+1, 1) = A\hat{x}(i, 1) + \phi\big(\tilde{x}(i \mid i)\big) + K_1(i)\tilde{y}_1(i, 1) \tag{26}$$

$$\hat{x}(k_l, 1) = \hat{x}(k_l, 2),$$

calculating $R_0(i)$, $K_0(i)$, and $R_\varnothing(i \mid i)$ according to formulas (17) to (19), and if $R_0(i)>0$ and $R_\varnothing(i \mid i)<0$, calculating $\check{z}_\varnothing(i \mid i)$ according to formula (20), and performing (6); or if $R_0(i)>0$ and $R_\varnothing(i \mid i)<0$ are not satisfied, resetting the value of $\gamma$, and performing (1);

(6) calculating the smoothing gain parameter $$R_{x,k_l}^i:$$

$$\begin{cases} R_{x,k_l}^i = R_{x,k_l}^{i-1}(A - K_1(i-1)C_1)^T & \tag{27} \\ R_{x,k_l}^{k_l} = P_1(k_l) \end{cases},$$

and, a smoothing estimation error variance $R_z(k_l \mid i)$:

$$R_z(k_l \mid i) =$$

$$LP_1(k_l)L^T - \gamma^2 I - K_z(k_l)R_1(k_l, 1)K_z^T(k_l) - \sum_{j=k_l+1}^{i} R_{k_l}^j R_1(j, 1)\big(R_{k_l}^j\big)^T,$$

wherein, $$R_{k_l}^j = LR_{x,k_l}^j C_1^T R_1^{-1}(j, 1),$$

if $R_z(k_l \mid i)<0$, calculating an H∞ smoothing estimate $\check{z}(k_l \mid i)$:

$$\check{z}(k_l \mid i) = \hat{z}(k_l \mid i-1) + LR_{x,k_l}^i C_1^T R_1^{-1}(i, 1)\tilde{y}_1(i, 1); \tag{29}$$

or, if $R_z(k_l \mid i)<0$ is not satisfied, resetting the value of $\gamma$, and performing (1);

(7) repeating (5) to (6) until i=k; and (8) setting k=k+1, and repeating (1) to (7) until k=N, wherein N represents a termination moment of measurement or prediction.

2. The method for sensing power grid information based on nonlinear robust estimation according to claim 1, wherein the converting the H∞ smoothing estimation problem into the generalized $H_2$ smoothing estimation problem specifically comprises:

converting the H∞ smoothing estimation problem into the generalized $H_2$ smoothing estimation problem in a space mapping manner according to the H∞ smoothing estimation performance indicator.

3. The method for sensing power grid information based on nonlinear robust estimation according to claim 1, wherein the constructing the H∞ smoothing estimator specifically comprises:

performing processing by using an output reconstruction method according to the generalized $H_2$ smoothing estimation problem to construct the H∞ smoothing estimator.

4. The method for sensing power grid information based on nonlinear robust estimation according to claim 1, wherein the nonlinear state-space distorted power grid model is a Lipschitz nonlinear system model.

5. The method for sensing power grid information based on nonlinear robust estimation according to claim 1, wherein the H∞ smoothing estimator is a Riccati-equation-based recursive H∞ smoothing estimator.

6. The method for sensing power grid information based on nonlinear robust estimation according to claim 1, wherein the obtaining the initial sensed amplitude value and the initial sensed phase value of the power grid voltage signal by using the H∞ smoothing estimator and performing zero-crossing point detection on the initial sensed amplitude value and the initial sensed phase value of the power grid voltage signal to obtain sensed amplitude, frequency and phase values of the distorted voltage specifically comprises:

determining, according to whether adjacent signals are opposite in sign, whether zero is crossed; and using a first zero-crossing point as a frequency determining standard, and using an amplitude of a zero-crossing point as an amplitude in a first half of the period.

7. The method for sensing power grid information based on nonlinear robust estimation according to claim 1, wherein the obtaining the nonlinear state-space distorted power grid model based on the phase voltage signal of the actual power grid and the virtual orthogonal signal of the phase voltage signal specifically comprises:

the phase voltage signal v of the actual power grid and the virtual orthogonal signal u of the phase voltage signal are represented as sums of a series of harmonics, defined as:

$$\begin{cases} v = \sum_{h=0} v_h = \sum_{h=0} V_h\cos\theta_h = \sum_{h=0} V_h\cos(h\omega t + \varphi_h) \\ u = \sum_{h=0} u_h = \sum_{h=0} V_h\sin\theta_h = \sum_{h=0} V_h\sin(h\omega t + \varphi_h) \end{cases}, \tag{1}$$

wherein, h represents a harmonic component order, $V_h$ represents an amplitude of an $h^{th}$ harmonic component, $\theta_h$ represents a phase angle of the $h^{th}$ harmonic component, $\varphi_h$ represents an initial phase angle of the $h^{th}$ harmonic component, $\omega$ represents an angular frequency of the actual power grid, t represents running time, $v_h$ represents an $h^{th}$ harmonic component of the phase voltage signal v of the power grid, and un represents an $h^{th}$ harmonic component of the virtual orthogonal signal u;

the $h^{th}$ harmonic components are represented as:

$$\begin{bmatrix} \dot{v}_h \\ \dot{u}_h \end{bmatrix} = \begin{bmatrix} 0 & -h\omega \\ h\omega & 0 \end{bmatrix} \begin{bmatrix} v_h \\ u_h \end{bmatrix}, \qquad (2)$$

wherein, $\dot{v}_h$ represents a derivative of $v_h$, and $\dot{u}_h$ represents a derivative of $u_h$; $\omega$ is an intermediate variable, and it is complex to estimate $\omega$, so that $\Omega$ is set as a frequency parameter to be estimated, and the following equations are defined:

$$\Omega = \frac{\omega^2}{\varpi}, \qquad (3\text{-}1)$$

$$\psi_h = \frac{\varpi}{\omega} u_h, \qquad (3\text{-}2)$$

wherein, $\psi_h$ represents a corrected virtual orthogonal signal, and $u_h$ represents an actual virtual orthogonal signal;

then, $$\begin{bmatrix} \dot{v}_h \\ \dot{\psi}_h \end{bmatrix} = \begin{bmatrix} 0 & -h\Omega \\ h\varpi & 0 \end{bmatrix} \begin{bmatrix} v_h \\ \psi_h \end{bmatrix}, \qquad (4)$$

wherein, $\varpi$ represents a set initial power grid frequency, and a sign with "⁻" above represents a derivative of a variable;

a fundamental signal of a phase voltage is extracted, an orthogonal signal is constructed, and if a sampling period Tis short enough, the formula (4) is discretized as:

$$\frac{x_0(k+1) - x_0(k)}{T} = \begin{bmatrix} 0 & 0 \\ \varpi & 0 \end{bmatrix} x_0(k) + \begin{bmatrix} 0 & -1 \\ 0 & 0 \end{bmatrix} x_0(k)\Omega + w_0(k), \qquad (5)$$

wherein, $$x_0(k) = \begin{bmatrix} x_{01}(k) \\ x_{02}(k) \end{bmatrix} = \begin{bmatrix} v(k) \\ \psi(k) \end{bmatrix},$$

and $w_0(k)$ represents a hypothetical process noise;
if:

$$\Omega(k+1) = \Omega(k) + w_1(k), \qquad (6)$$

wherein, $\Omega(k+1)$ represents a frequency parameter estimated at a moment k+1, $\Omega(k)$ represents a frequency parameter estimated at a moment k, $w_1(k)$ represents a hypothetical process noise, and k represents the second sampling moment;

based on the formula (5) and the formula (6), a state equation is redescribed as:

$$\begin{bmatrix} x_1(k+1) \\ x_2(k+1) \\ x_3(k+1) \end{bmatrix} = \begin{bmatrix} 1 & 0 & 0 \\ T\varpi & 1 & 0 \\ 0 & 0 & 1 \end{bmatrix} \begin{bmatrix} x_1(k) \\ x_2(k) \\ x_3(k) \end{bmatrix} + \begin{bmatrix} -T \\ 0 \\ 0 \end{bmatrix} x_2(k)x_3(k) + w(k), \qquad (7)$$

wherein $$x(k) = \begin{bmatrix} x_1(k) \\ x_2(k) \\ x_3(k) \end{bmatrix} = \begin{bmatrix} v(k) \\ \psi(k) \\ \Omega(k) \end{bmatrix},$$

and w(k) represents a hypothetical process noise;
further, a first observation equation is constructed:

$$yx_1(k) = [1 \ 0 \ 0]x(k) + v_1(k), \qquad (8)$$

wherein, $yx_1(k)$ represents an observed value, and $v_1(k)$ represents an observed noise;
if an ideal voltage signal is:

$$\alpha(k) = A\cos(2\pi wkT)$$

$$\beta(k) = A\sin(2\pi wkT)$$

wherein, $\alpha(k)$ represents a cosine component of an ideal voltage signal at the moment k; and $\beta(k)$ represents a sinusoidal component of the ideal voltage signal at the moment k;

then a second observation equation is:

$$yx_2(k) = \frac{a\tan\left(\frac{\beta(k)}{\alpha(k)}\right)}{2\pi kT} = [0 \ 0 \ 1]x(k) + v_2(k), \qquad (9)$$

wherein, $yx_2(k)$ represents an observed value, and $v_2(k)$ represents an observed noise;
based on the above discussion, the phase voltage model is represented as follows:

$$\begin{cases} x(k+1) = Ax(k) + B\emptyset(x(k)) + w(k) \\ y(k) = Cx(k) + v(k) \\ z(k) = Lx(k) \\ x(0) = x_0 \end{cases} \qquad (10)$$

wherein, $$A = \begin{bmatrix} 1 & 0 & 0 \\ T\bar{\omega} & 1 & 0 \\ 0 & 0 & 1 \end{bmatrix}, B = \begin{bmatrix} -T \\ 0 \\ 0 \end{bmatrix}, C = \begin{bmatrix} 1 & 0 & 0 \\ 0 & 0 & 1 \end{bmatrix}, y(k) = \begin{bmatrix} yx_1(k) \\ yx_2(k) \end{bmatrix},$$

$$v(k) = \begin{bmatrix} v_1(k) \\ v_2(k) \end{bmatrix},$$

$x_0$ represents an initial state of $x(k)$, L represents the unit matrix, and $z(k)$ represents a signal to be sensed; and $\emptyset(x(k)) = x_2(k)x_3(k)$ is a nonlinear term that satisfying the following Lipschitz condition:

$$\|\emptyset(x(k)) - \emptyset(\hat{x}(k))\| \leq \gamma_1 \|F(x(k) - \hat{x}(k))\|, \tag{11}$$

wherein, $\gamma_1$ and F respectively represent a Lipschitz constant and the constant matrix, and $\hat{x}(k)$ represents a state estimate of $x(k)$.

8. The method for sensing power grid information based on nonlinear robust estimation according to claim 1, wherein the establishing the H∞ smoothing estimation performance indicator based on the nonlinear state-space distorted power grid model specifically comprises:

if the H∞ estimation performance indicator is a given scalar $\gamma > 0$, a smoothing step number $l \geq 0$, and an observation sequence $$\{y(i)\}_{i=0}^{k},$$

seeking for an estimator $\check{z}(k_l|k)$ $(k_l = k - l)$ satisfying the performance indicator for a signal $z(k)$:

$$\left[ \sup_{(x_0, w, v) \neq 0} \left( \frac{\sum_{k=0}^{N} \|\check{z}(k_l \mid k) - z(k)\|^2}{\|x_0 - \check{x}_0\|_{P_0^{-1}}^2 + \sum_{k=0}^{N} \|w(k)\|^2 + \sum_{k=0}^{N} \|v(k)\|^2} \right) \right] < \gamma^2, \tag{12}$$

wherein, $\check{x}_0$ and $P_0$ respectively represent the given state estimate initial value and a positive definite matrix; k represents the second sampling moment; $x_0$ represents the initial state value of the phase voltage model; w represents a process noise of the phase voltage model; v represents a measured noise of the phase voltage model; and N represents the termination moment of measurement.

\* \* \* \* \*